United States Patent [19]

Collins et al.

[11] 4,021,741
[45] May 3, 1977

[54] REMOTE CONTROL WITH REDUCED RESPONSIVENESS TO INTERRUPTED ACTUATING SIGNALS

[75] Inventors: Johnny Collins, Oak Park; Richard G. Merrell, Darien; David A. Blass, Elmwood Park, all of Ill.

[73] Assignee: Zenith Radio Corporation, Glenview, Ill.

[22] Filed: May 29, 1975

[21] Appl. No.: 582,048

[52] U.S. Cl. .............................. 328/69; 307/233 R; 307/234; 328/73; 328/130; 340/168 B

[51] Int. Cl.² ...................................... H03K 17/26

[58] Field of Search ................. 328/72, 73, 74, 75, 328/97, 48, 119, 120, 129, 130; 307/233, 234, 247 A

[56] References Cited

UNITED STATES PATENTS

| | | | |
|---|---|---|---|
| 3,280,937 | 10/1966 | Faber, Jr. et al. | 307/233 |
| 3,582,795 | 6/1971 | Heick | 328/72 |
| 3,601,706 | 8/1971 | Battle et al. | 328/119 |
| 3,855,575 | 12/1974 | Leuschner et al. | 340/148 |

Primary Examiner—John Zazworsky
Assistant Examiner—Marcus S. Rasco
Attorney, Agent, or Firm—Nicholas A. Camasto

[57] ABSTRACT

A wireless remote control system has a transducer coupled to a sampling frequency counter to distinguish among various actuating signals. A comparator compares present and immediately preceding measurements and a confidence counter counts the number of identical comparisons and is reset for non-identical comparisons. A decoder which is disabled until the confidence counter reaches a predetermined count is coupled to utilization means to actuate the selected function. Logic means contain a clock controlled interval counter which is activated only after the confidence counter reaches the predetermined count for establishing a timing interval. During the interval logic means render the confidence counter unresponsive to the comparator thereby maintaining actuation of selected functions. Logic means also force a preset count into the interval counter to prevent establishing the timing interval for other functions.

9 Claims, 1 Drawing Figure

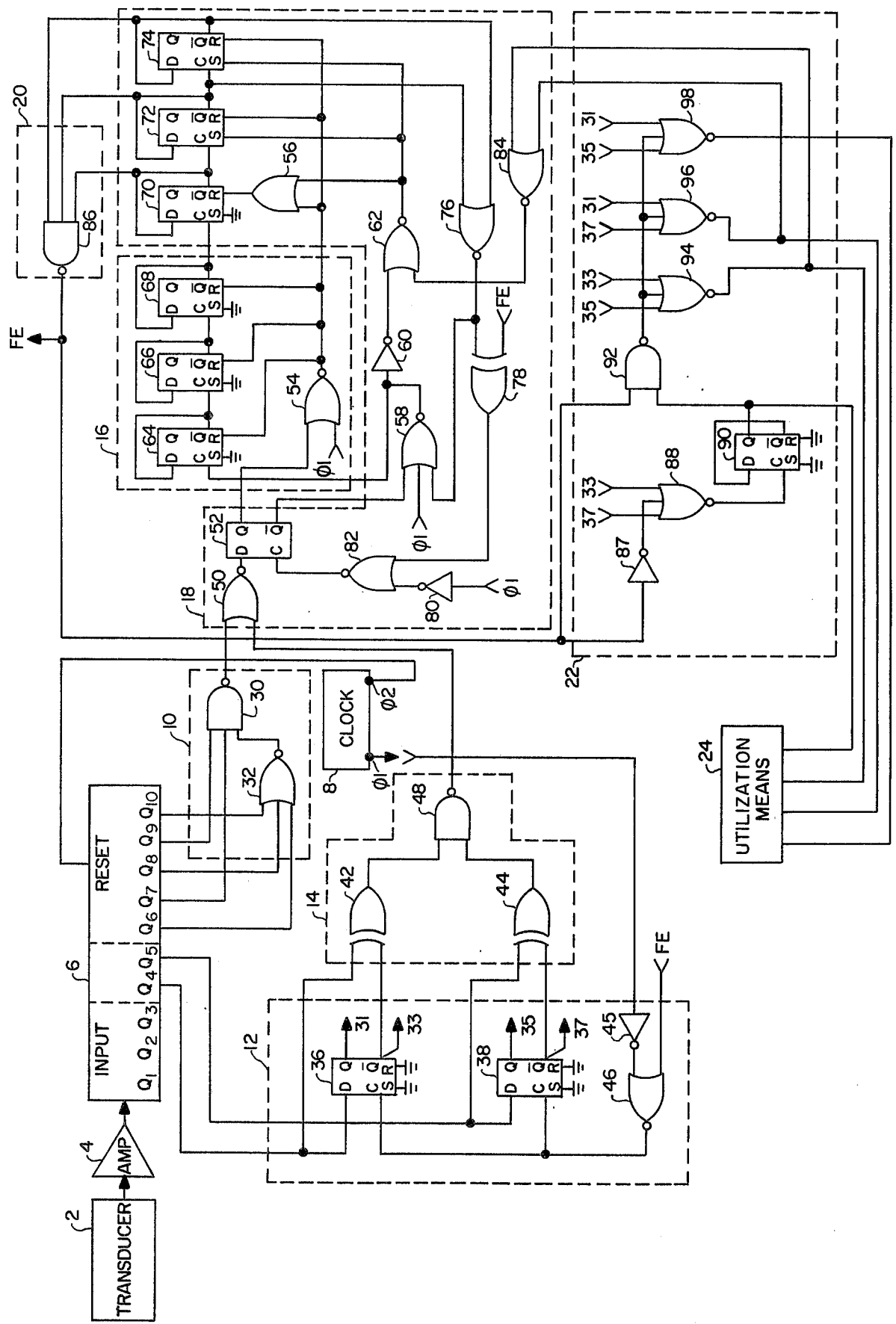

REMOTE CONTROL WITH REDUCED RESPONSIVENESS TO INTERRUPTED ACTUATING SIGNALS

CROSS REFERENCE TO RELATED APPLICATION

This application is related to copending application, Ser. No. 556,760, filed Mar. 10, 1975 and entitled "Digital Remote Control System with Signal Verification" in the names of Robert R. Podowski and Johnny Collins, assigned to the assignee of the present application and which is hereby incorporated by reference.

BACKGROUND OF THE INVENTION

The invention is concerned with wireless remote control systems. While the invention is not to be so restricted, it will be discussed in the environment of a wireless remote control system for a television receiver. Such systems normally include a transducer for converting control signals into corresponding electrical signals, decoding circuits for determining which function has been selected, and utilization circuits for performing the selected function. Various forms of noise immunity circuits are also included to enable such systems to distinguish between intentionally generated control signals and spurious signals.

Ultrasonic remote control systems have for years been a popular control medium for television receivers and are well known in the art. Several of such systems are suitable for fabrication in an integrated circuit employing digital techniques. Generally a clock is coupled to counters which sample an incoming signal to determine its frequency. Noise immunity is usually achieved by a detector and noise suppressor circuit which requires that a valid control signal have a constant amplitude for some fixed period of time. The output of the detector and noise suppressor is coupled through a pulse shaper to a clock controlled frequency counter.

Because of the high speed operation of the digital electronics which are used to sample and count frequency, the frequency sensing system may be responsive to seemingly minor variations in signal reception under cetain conditions. An interruption in the incoming signal would cause a variation in the digital count for the frequency and the reoccurrence of the proper signal would be interpreted as a second actuation. This is especially significant where a selected function is noticeably altered by a detected variation of the incoming signal. Two striking examples of the effect of an interpretation of a second actuation may be seen in the off-on and mute functions. If a command to turn a set on is interrupted the result is a persistance of the off condition. This result is quite pronounced from the one expected, annoying to the viewer, and not difficult to produce. Simply moving the hand-held remote control sending unit while emitting an actuating signal may cause a relocation of an acoustic pressure node at the receiver sufficient to produce an interruption.

In an effort to prevent the possibility of such inadvertently interrupted signals, applicants have developed a novel structure for selectively reducing the responsiveness of the system. Applicants' invention concerns providing a time, after detection and identification of certain signals, during which the remote control system is rendered unresponsive to variations in the incoming signal. The off-on function is perhaps the first choice for protection by applicant' invention. Applicants' circuit embodiment provides a time to render the off-on command unresponsive to variations in the incoming signal thereby preventing unexpected interpretations of second activations to nullify the effect of the original actuating signal.

OBJECTS OF THE INVENTION

An object of this invention is to provide a novel remote control system.

Another object of this invention is to provide an improved remote control system with diminished responsiveness to variations in actuating signals.

SUMMARY OF THE INVENTION

In accordance with the invention, a digital circuit for actuating functions having at least two states includes means for receiving an actuating signal, means generating a control signal in response to the actuating signal, means for changing states responsive to each occurrence of the control signal and means for preventing false state changes occasioned by a temporary interruption of the actuating signal comprising logic means for maintaining the control signal for a predetermined interval after establishment of a state.

BRIEF DESCRIPTION OF THE DRAWING

The single FIGURE shows the detailed circuitry of the preferred embodiment of the invention with functional segments enclosed by broken lines. For simplicity, only logic connections are shown in the FIGURE without connections to voltage sources. Positive logic is used throughout and logic gates are simply referred to by their functional names, i.e., NAND, EXCLUSIVE OR and NOR, without the word "gate". A 1 represents a high logic (or signal voltage) level and a 0 corresponds to a low logic level. All binary representations are arranged in ascending powers of 2 from left to right to correspond to the terminal arrangement of the binary counters.

The terms "input" and "output" generally indicate the device terminal unless signal is specified. The term "inhibit" indicates the condition in which a gate output is no longer dependent upon signals applied to its remaining inputs. The term "enable" designates the condition in which a gate output is dependent upon the signals applied to the remaining inputs.

DESCRIPTION OF THE PREFERRED EMBODIMENT

Referring to the drawing for a general description of the function of the circuit, a transducer 2 converts received signals, such as acoustic signals in an ultrasonic frequency range, into corresponding electrical signals of the same frequency. The actuating signals have individual characteristics, namely, their frequencies, and a common characteristic of persistence for a minimum duration. An amplifier 4 is coupled between transducer 2 and a ten stage binary counter 6 for providing properly shaped and amplified pulses for counting. Counter 6 samples, under the control of clock 8, the incoming signal to determine its frequency, and is connected to a range detection circuit 10. Frequency is the characteristic by which the various control signals are distinguished. Confidence counter 16 is responsive to range circuit 10 through logic circuit 18 and resets when an out-of-range count is detected.

Counter 6 is coupled directly to a storage circuit 12 and a comparator 14. A portion of the frequency count is compared with the immediately preceding count portion and stored. The output of storage circuit 12 is also coupled to comparator 14 which, in turn, is coupled through logic circuit 18 to confidence counter 16. Comparisons which show identity between present and previous count portions permit counter 16 to advance without resetting, whereas detection of a non-identity condition causes counter 16 to reset. Clock 8 is coupled to counter 6, storage circuit 12, comparator 14, confidence counter 16 and logic circuit 18 to provide an appropriate operational timing sequence. Storage circuitry 12 and logic circuit 18 are independently coupled to a decoder 22. When confidence counter 16 has been advanced to a predetermined count, the counting section of logic circuit 18 begins counting clock pulses to establish a predetermined timing interval. Decoder 22 is enabled through control signal generation circuit 20 to decode the stored count portion from storage circuitry 12 and supply an appropriate signal to a plurality of utilization means 24 for activation of one of the states of the selected control function.

When decoder 22 is enabled logic means 18 operates in either of two ways depending upon which function has been selected by an actuating signal. For some functions including the on/off function, confidence counter 16 is disabled from detecting any variations in the received signal for the entire predetermined timing interval; for other functions, logic means 18 forces a preset into its counting section to produce a reenabling of confidence counter 16. Thus, logic means 18 disables the system's response to variations in the detected signal when the on/off and mute functions are selected.

Counting by the first three stages of counter 6 is ignored, allowing a range of frequencies to designate individual control functions. The 02 terminal of clock 8 is connected to the reset terminal of counter 6. The Q6, Q8 and Q10 terminals of counter 6 are connected to inputs of a NOR 32 whose output is coupled to one input of a NAND 30. The Q7 and Q9 terminals of counter 6 are connected to the second and third inputs of NAND 30. The output of NAND 30 is connected to the first input of a NOR 50. As indicated by the enclosing broken line, NOR 32 and NAND 30 comprise range detection circuit 10.

The Q4 terminal of counter 6 is connected to one input of an EXCLUSIVE OR 42 and to the D terminal of a data flip-flop 36. The Q5 terminal of counter 6 is coupled to one input of an EXCLUSIVE OR 44 and the D terminal of a data flip-flop 38. An EXCLUSIVE OR is a logic gate which produces a 0 logic level signal at its output whenever both inputs are at the same logic level and a 1 logic level signal output otherwise. The 01 terminal of clock 8 is connected through an inverter 45 to one input of a NOR 46. The second input of NOR 46 is supplied with a signal labelled FE. The output of NOR 46 is connected to the C terminal of flip-flops 36 and 38. For convenience, the Q and $\overline{Q}$ terminals of flip-flops 36 and 38 are labelled 31, 33, 35 and 37, respectively. The R and S terminals of both flip-flips 36 and 38 are connected to ground. As indicated by the enclosing broken line, flip-flops 36 and 38, inverter 45 and NOR 46 comprise storage circuit 12.

The $\overline{Q}$ terminal of flip-flip 36 is connected to the second input of EXCLUSIVE OR 42 and the $\overline{Q}$ terminal of flip-flop 38 is connected to the second input of EXCLUSIVE OR 44. The outputs of EXCLUSIVE OR 42 and 44 are connected to the inputs of a NAND 48 whose output is connected to the second input of NOR 50. As indicated by the broken line, EXCLUSIVE OR's 42 and 44 and NAND 48 comprise comparator 14.

The output of a NOR 50 is coupled to the D terminal of a flip-flop 52. The Q terminal of flip-flop 52 is coupled to one input of a NOR 54. The 01 terminal of clock 8 is coupled to the second input of NOR 54 whose output is coupled to the R terminals of flip-flops 64, 66, 68, 72 and 74 and to one input of NOR 56.

As indicated by the broken line, flip-flops 64, 66 and 68 and NOR 54 comprise confidence counter 16. The S terminals of each of the three flip-flops are connected to ground. The $\overline{Q}$ terminal of flip-flop 64 is coupled to its D terminal and to the C terminal of flip-flop 66. Similarly, the $\overline{Q}$ terminal of flip-flip 66 is coupled to its D terminal and to the C terminal of flip-flop 68. The $\overline{Q}$ terminal of flip-flop 68 is coupled to its D terminal and to the C terminal of flip-flop 70.

The S terminal of flip-flop 70 is coupled to ground. The $\overline{Q}$ terminal of flip-flop 70 is coupled to its D terminal, to the first input of a NAND 86 and to the C terminal of a flip-flop 72. The $\overline{Q}$ terminal of flip-flop 72 is coupled to its D terminal, to the second input of NAND 86, to the first input of a NOR 76 and to the C terminal of a flip-flop 74. The $\overline{Q}$ terminal of flip-flop 74 is coupled to its D terminal, to the third input of NAND 86 and to the second input of NOR 76. The output of a NOR 62 is coupled to the second output of OR 56 and to the S terminals of flip-flops 72 and 74.

The $\overline{Q}$ terminal of flip-flop 52 is coupled to one input of a NOR 58. The 0 1 terminal of clock 8 is coupled to the second input of NOR 58. The output of NOR 58 is coupled directly to the C terminal of flip-flop 64 and through inverter 60 to the first input of NOR 62. The output of NOR 76 is coupled to a first input of EXCLUSIVE OR 78 and to the third input of NOR 58. The output of NAND 86 is labelled FE and is coupled to the second input of EXCLUSIVE OR 78 whose output is coupled to the first input of a NOR 82. The 01 terminal of clock 8 is coupled through inverter 80 to the second input of NOR 82. The output of NOR 82 is coupled to the C terminal of flip-flop 52. The output of a NOR 84 is coupled to the second input of NOR 62.

As indicated by the broken line, logic circuit 18 comprises NOR's 50, 58, 62, 76, 82 and 84, OR 56, EXCLUSIVE OR 78, flip-flops 52, 70, 72 and 74 along with inverters 60 and 80 while control signal generating circuit 20 comprises NAND 86.

The $\overline{Q}$ terminals of flip-flip 36 and 38 are connected to the second and third inputs of NOR 88. The Q terminals of flip-flop 36 and 38 are connected to the first and second inputs of a NOR 98. The $\overline{Q}$ terminal of flip-flop 36 and the Q terminal of flip-flop 38 are connected to the first and second inputs of a NOR 94. The Q terminal of flip-flop 36 and the $\overline{Q}$ terminal of flip-flop 38 are connected to the first and second inputs of a NOR 96.

The output of NAND 86 is coupled to the first input of NAND 92 and through inverter 87 to the third input of NOR 88. The output of NOR 88 is coupled to the C terminal of flip-flop 90. The S and R terminals of flip-flop 90 are connected to ground. The $\overline{Q}$ terminal of flip-flop 90 is connected to its D terminal. The Q terminal of flip-flop 90 is connected to the second input of NAND 92 and to utilization means 24. The output of NAND 92 is connected to the third inputs of NOR's 94, 96 and 98. The output of NOR 98 is connected to utilization means 24. The outputs of NOR's 94 and 96 are connected to the inputs of NOR 84 and to utilization means 24. The output terminals of NOR's 94, 96 and 98 and the Q terminal of flip-flop 90 will maintain logic levels which activate utilization means corresponding to the controlled functions.

Utilization means 24 is shown in a separate block and comprises the circuitry and apparatus (not illustrated) for actuating the controlled functions. As an example, the output of NOR 98 may be coupled to a flip-flop in combination with a digital to analog converter and a varistor. Repetitive signals from NOR 98 would change status of the flip-flop to produce voltage changes to which the varistor would respond by alternately activating the selected function, such as the volume mute for a television receiver. Additional NOR's may be similarly connected to flip-flops for providing actuation of various control functions or may be connected to a stepper motor for providing more complicated functions, such as tuning the television receiver. Such voltage responsive control techniques are well-known to those skilled in the art and are not a part of this invention.

The timing sequence for the control units is determined by clock 8. Clock 8 may be operated from the power line to which the television receiver or control unit is connected. The timing signal at the 01 clock terminal is a short duration (approximately 2 microseconds long) positive rectangular pulse of a 1 logic level which occurs every 8.33 ms. (millisecond). The timing signal at the 02 terminal is approximately a 2 microsecond rectangular pulse of a 1 logic level whose positive going leading edge corresponds to the occurrence of the trailing edge of a 01 pulse. The 02 pulse is used exclusively to reset counter 6 for the next sampling period.

Counter 6 is a continuously operating ten stage binary ripple counter which is reset to zero for counting the frequency of the incoming signals to determine if they are control signals. The counter supplies information to storage circuit 12, comparator 14 and range detection circuit 10. The 1 level portion of the 01 pulse establishes the comparison interval and produces, during appropriate conditions, a reset signal for confidence counter 16 and the counting section of logic circuit 18. Because the clock terminals of the data flip-flops respond to edge triggering, data is transferred to storage circuit 12, logic circuit 18, confidence counter 16 and the counting section of logic circuit 18 is advanced, immediately after an identity comparison and during occurrence of the trailing edge of a 01 pulse.

To aid in understanding the operation of the circuit, assume that the control signals are square waves having four ultrasonic frequency ranges A, B, C and D comprising 38.4 to 39.24 KHz, 39.36 to 40.20 KHz, 40.32 to 41.16 KHz and 41.28 to 42.12 KHz corresponding to four television control functions respectively. The number of ranges is chosen only for convenience in the description. The short duration 01 and 02 timing pulses may occur any time during detection of the relatively long period of the control signals without substantially disturbing the counting of counter 6. In the 8.33 ms. counting interval, the frequencies in the above ranges correspond to decimal counts of 320–327, 328–335, 336–343 and 344–351 respectively. It is advantageous to designate control functions which correspond to signals in the various frequency ranges. Range D will correspond to the off-on function; ranges C and B to the channel down and channel up functions respectively; and range A to the volume mute function. For frequency range A, the 10 stage counter will read (binary counter notation) XXXO001010. For range B the counter will read XXX1001010. In the C and D ranges, the Q4 and Q5 terminals are respectively 01 and 11, and the Q6 through Q10 terminals will remain at 01010. The output of NOR 32 is at 1 for Q6 and Q8 and Q10 at 0. This output signal level is combined with Q7 and Q9 1 level output signals to produce a 0 level output signal from NAND 30, which indicates the detected signal frequency is in the proper range.

The storage, comparison and counting operations are performed according to a fixed timing sequence. Assume that terminals 31 and 35 of storage flip-flops 36 and 38 respectively are at 0 and that counter 6 has just been reset by a 02 pulse to begin a new counting interval. As counting proceeds, the Q4 and Q5 terminals continuously supply signals to the D terminals of flip-flops 36 and 38, respectively, as well as to EXCLUSIVE OR's 42 and 44 in the comparator circuit. The comparator output normally indicates non-identity through NAND 48 at a 1 level but at the end of the counting interval when the new count is transferred into storage circuit 12 the comparison is made and a 0 level at NAND 48 indicates identity.

EXCLUSIVE OR 42 compares the signal at the $\overline{Q}$ terminal of flip-flop 36 with the present Q4 signal level. If its inputs are at different signal levels, the output of EXCLUSIVE OR 42 is at 1, indicating identity between the present and previous Q4 signal levels. Similarly, EXCLUSIVE OR 44 compares the signal level on the Q5 terminal with the inversion of the previous Q5 signal present at the $\overline{Q}$ terminal of flip-flop 38. Again, if the inputs are different, the output of EXCLUSIVE OR 44 is at 1 indicating identity between the present and previous Q5 signal levels. For an identity between the previous and present signal levels of both Q4 and Q5, the inputs of NAND 48 are at 1 and its output is at 0.

A signal is said to be valid whenever an identity and in-range condition occurs. The information is transferred to the Q terminal of flip-flop 52 through NOR 50 at the leading edge of a 01 clock pulse. The combination of a NOR gate and a flip-flop comprise a temporary storage for the condition of verification of the signal.

The 01 terminal of clock 8 is coupled through inverter 45 to NOR 46, which when enabled has its output normally at 0 but goes to 1 for the duration of the 01 pulse, and which is used to clock the C terminals of flip-flops 36 and 38. When these storage flip-flops are clocked, the signal levels on their D terminals are transferred to their Q terminals. If, for example, during the next counting interval Q4 and Q5 change, and correspondingly the D terminals of flip-flops 36 and 38, then at the end of the next 01 timing pulse the new data will be stored in the flip-flops. Thus, with each succeeding 01 timing pulse a comparison is made and, at the end of the comparison, the storage flip-flops are clocked so that their Q terminals maintain the last previous Q4 and Q5 signal levels.

Confidence counter 16 and the counting section of logic circuit 18 are reset whenever a non-identity or out-of-range condition occurs. Confidence counter 16 is a 3 stage binary counter initially established, by a reset pulse from NOR 54, at a 000 state (decimal 0) as determined by the logic levels on the Q terminals. The states of the counter may be described by specifying the logic levels at either the Q or $\overline{Q}$ terminals. Although the Q terminals are not connected to any logic gates it will be appreciated that the specification of the logic levels at these terminals provides a simplified description for a binary up counter. Each in-range identity comparison (valid signal) permits the confidence counter to be clocked by the 01 timing pulses through NOR 58 to count up without being reset until it reaches a 111 state, indicating that the received signal is properly verified as possessing the proper duration for a control signal. When either an out-of-range or non-identity condition is detected, and the information is transferred into temporary storage, the Q terminal of flip-flop 52 will be at 0. This 0 level signal at the Q terminal enables the normally inhibited NOR 54 to permit a reset pulse causing confidence counter 16 to be reset to the 000 state to again begin counting up by the $\overline{01}$ timing pulses. The corresponding level signal at the $\overline{Q}$ terminal also temporarily inhibits NOR 58 to prevent counting until an in-range identity condition is detected.

Assume an in-range count (NAND 30 is at 0), and an identity indication in the comparator (NAND 48 is at 0). No resetting of flip-flops 64, 66 and 68 occurs. The confidence counter counts up with each 01 pulse allowed through NOR 58 (corresponding to a simultaneous identity comparison and an "in-range" condition) to indicate an increased level of confidence.

Assume now that an out-of-frequency range signal is received. The comparator indicates identity but the range detection circuit indicates an out-of-range condition is evidenced by a one level output signal at NAND 30 since the Q6–Q10 terminals are not at 01010, respectively. Because of the out-of-range condition, the output of NOR 50 goes to 0 and a 0 is established at the Q output terminal of flip-flop 52. NOR 54 is enabled to provide a reset pulse to the counters and confidence counter 16 is prepared to again gain confidence.

Logic circuit 18 contains three distinguishable sections. NOR 50 and flip-flop 52 comprise a temporary storage for valid signal detection; flip-flops 70, 72 and 74 provide a counting section; and the remaining gates provide a combinational logic circuit to perform the several functions. The temporary storage section can lock out or prevent any response by confidence counter 16 to variations in validity detection since the clock terminal of flip-flop 52 is controlled by the output of NOR 82 which may be inhibited.

For the temporary storage section under the condition of an in-range identity, NAND 30 and NAND 48 are at zero and the output of NOR 50 is at one. This 1 level is supplied to the D terminal of flip-flop 52. The information is transferred to the Q terminal when a 01 clock pulse is permitted to pass through NOR 82. NOR 82 is never inhibited during the period for gaining confidence but as will be discussed below, it may be afterwards. Information concerning an in-range identity may only be transferred to confidence counter 16 by clocking flip-flop 52.

After confidence has been gained in counter 16, the additional clock pulses cause advancement of flip-flops 70, 72 and 74 which comprise the counting section of logic circuit 18. When the first additional pulse is counted, the normal 000 state is changed. This is indicated by the output of NOR 86 which is at 0 while the flip-flops are in a reset state and goes to 1 when the counting section assumes any other state. Thus, when the first pulse is counted the signal labelled FE goes to 1. FE at 1 inhibits NOR 46 and prevents additional clocking of flip-flops 36 and 38, thus preventing new data from the Q4 terminals of counter 6 from being transferred into storage circuit 12. The FE signal also enables both NAND 92 and, through inverter 87, NOR 88 in decoder 22.

After confidence has been gained and the signal verified additional incoming signal detection and comparison are prevented from affecting the counting by inhibiting the transfer of information through flip-flop 52. For the on/off and mute functions a timing interval during which the system is unresponsive to variations in the incoming signal begins and continues until the counting section of logic circuit 18 reaches a predetermined count. The FE signal is also maintained at a constant level during this interval. If, however, the incoming signal corresponds to a channel up or down command, a preset count is forced into the counting section to cause immediate re-enablement of the information transfer in flip-flop 52 to again begin confidence counting.

The counting section of logic circuit 18 comprises three flip-flops arranged in the form of a ripple counter each containing a connection to NOR 54 which allows them to be reset. At the beginning of a confidence counting interval, flip-flops 70, 72 and 74 are in a 000 state as indicated by the levels of their Q terminals. The interconnections among all of the flip-flops 64 through 74 form them into one large binary ripple counter. The last three flip-flops also have connections to NOR 62 which, when at an appropriate logic level, forces the establishment of a preselected state. The preselected state as indicated in flip-flops 70, 72 and 74 is 011 respectively for the Q terminals which corresponds to decimal 6. The occurrence of this state is sensed by NOR 76 which is coupled to EXCLUSIVE OR 78 and NOR 58. Recalling that the FE signal is applied at the second terminal of EXCLUSIVE OR 78, the output of EXCLUSIVE OR 78 provides the lock out feature after the occurrence of FE at 1 and until the preselected state is reached by inhibiting NOR 82 to prevent clock pulses from being received by flip-flop 52. NOR 62 is responsive, through NOR 84, to NOR's 94 and 96 which correspond to the channel up and channel down functions in decoding means 22. After an on state has been detected if either NOR 94 or NOR 96 is at 1, a preset count is established through NOR 62 in the counting section of logic circuit 18.

Logic circuit 18 is arranged such that with the detection of the channel up and channel down functions, the predetermined timing interval count is forced or preset into flip-flops 70 to 74 to cause an immediate enabling of NOR 90 to release flip-flop 52 and restore responsiveness to the incoming signal. NOR 84 is coupled to respond to either of the two selected functions. The normal 1 output of NOR 84 inhibits NOR 62 and prevents the establishment of the preset count in flip-flops 70 through 74. However, when either of the two preselected functions are detected by decoder 22, by the occurrence of a 1 level at their decoding NOR's, the output of NOR 84 goes to 0 which enables NOR 62 to respond to a 01 clock pulse and cause a presetting of the counters to establish the predetermined 011 state in the counting section.

Consider the sequence of timing for the entire system. A first 01 timing interval will be employed to gain a reference count for subsequent comparisons for identity. The next 8 01 pulses correspond to the 8 counts required for confidence counter 16. A total time of 75 ms. (9·01 intervals) will have elapsed from the initial reception of any signal to the gaining of confidence.

The sequence of events after confidence counter 16 has achieved the 111 state is as follows. The next 01 pulse passing through NOR 58 initiates counting in the counting section of logic circuit 18. This counting section continues to count 01 clock pulses coming through NOR 58 but the pulses no longer have a correlation to the detection of in-range identical frequency measurements since flip-flop 52 has rendered the system unresponsive to incoming signals. The counting section counts from 000 to 011 (decimal 6). Because of the interconnection of all six of the flip-flops the total timing interval for both confidence and delay is 48·01 clock intervals plus a 49th for establishing the initial reference. Thus, the predetermined state in the counting section of logic circuit 18 can only be reached after 49·01 pulses which corresponds to 408 ms. total elapsed time from the first detection of the off/on or mute control signal.

The timing of controlling signals of logic circuit 18 may now be described. The FE signal level is normally at 0 during the acquisition of confidence but goes to 1 at 75 ms. and remains there until a reset through NOR 54 occurs. The output of EXCLUSIVE OR 78 may be referred to as a carry-on signal which is at 1 only between 75 and 408 ms. As long as the output of EXCLUSIVE OR 78 remains at 1, no information can be transferred to flip-flop 52 because NOR 82 is inhibited. It is this signal which renders confidence counter 16 and the counting section of logic circuit 18 insensitive to variations in the incoming signal. The output of NOR 76 may be referred to as a latch signal which goes to 1 at 408 ms. The latch signal operating through NOR 58 prevents counting beyond the predetermined state by inhibiting NOR 58. The counting section of logic circuit 18 begins with all 0's in a reset state and counts up to the predetermined state. The counters remain in this predetermined state until a reset pulse caused by detection of a non-identity or out-of-range signal occurs.

At the predetermined state (011) the Q terminals of flip-flops 72 and 74 are at 0. The output of NOR 76 (latch) which was normally at 0 is now at 1 to inhibit further counting through NOR 58. This 1 level signal is also combined with the 1 level FE signal at the inputs of EXCLUSIVE OR 78 and the output of EXCLUSIVE OR 78 goes to 0. This 0 level signal enables NOR 82 so that subsequent 01 pulses can clock flip-flop 52 to again make the counting system responsive to the detection of incoming signals.

Decoding means 22 includes an array of NOR gates for decoding information from storage circuit 12 and activating control of selected functions. For a selected frequency range (Range D) the off/on function enables decoder 22 to respond to the other activation signals. This is achieved by having a decoding NOR 88 coupled to the clock terminal of a flip-flop 90 whose Q terminal output is coupled, with the FE signal, to the input terminals of a NAND 92. The FE signal enables both NOR 88 and NAND 92 but subsequent enabling of additional decoding NOR's can only occur if the Q terminal of flip-flop 90 is at a 1 level which is indicative of an "on" state. Flip-flop 90 has its $\overline{Q}$ terminal coupled to its D terminal and its states may be changed only when a positive going edge is detected at its clock terminal. This positive going edge can only result from the 0 to 1 level change in the FE signal which occurs after confidence has been acquired. This 0 to 1 transition clocks the C terminal of flip-flop 90 to change the state from its previous to the present selected state. Thus, it may be seen that the state of the flip-flop is changed only at the occurrence of the FE control signal. The Q terminal of flip-flop 90 is also coupled to utilization means 24 to provide the actuation of the off/on utilization means. When in an "on" state the Q terminal of flip-flop 90 is at 1 which in combination with FE at 1 enables the remaining decoding NOR's.

It may be seen that an interruption of the detected signal after confidence is acquired would cause both the confidence counter and counting section of logic means 18 to be reset and would cause a corresponding interruption in the 1 level of the FE signal. When the incoming signal is again detected, confidence would be regained, as in the case of detection of a second actuating signal, and the re-establishment of the FE signal operating through NOR 88 would clock flip-flop 90 to the next state. Therefore, if a command to turn the set on were temporarily interrupted after confidence had been acquired, when confidence was re-established some 75 ms. later the set would turn off. Thus, the viewed could encounter the frustration of having his set momentarily turn on and then turn off. The protection afforded by rendering the control signals unresponsive to variations in the incoming signal prevents this type of occurrence. If, however, an interruption is detected after the timing interval, it will be interpreted as a second activation of the function. An interruption while acquiring confidence merely resets the confidence counter and no function activation occurs.

NOR 98 is coupled directly to utilization means 24 to control the volume mute function which corresponds to that decoding. Utilization means 24 would contain a flip-flop to maintain the two possible states for the volume mute control. This function is also rendered unresponsive during the timing interval to prevent false actuations.

What has been shown is a novel remote control system with selective sensitivity to control signals. It repetitively measures the frequency of control signals to verify that a valid signal has been received. A predetermined number of consistent measurements must be detected before the received signal is verified and decoded. Selected control frequencies establish a time interval after acquiring verification, and during which the system is rendered unresponsive to interruptions in the incoming signal. During this interval activation of the function is maintained.

While particular embodiments of the invention have been shown and described, it will be obvious to those skilled in the art that changes and modifications may be made thereto without departing from the invention in its broader aspects and, therefore, the aim in the appended claims is to cover all such changes and modifications as fall within the true spirit and scope of the invention.

What is claimed is:

1. A digital circuit for selectively actuating a plurality of functions including an on-off function comprising:
receiving means for receiving actuating signals;
clock means;
generating means, coupled to said receiving means, for generating a control signal in response to reception of an actuating signal;
decoding means, coupled to said generating means and said receiving means, cooperating with said control signal for selectively actuating said functions at each occurrence of said control signal;

logic means, coupled to said generating means, for maintaining said control signal for a predetermined timing interval after actuation of said on-off function; and counting means coupled between said logic means and said clock means and responsive to said clock means for establishing said predetermined timing interval.

2. The digital circuit of claim 1 wherein said means for generating a control signal is responsive to said counting means.

3. The digital circuit of claim 2 wherein said logic means further includes means for presetting a count in said counting means, for all functions except said on-off function, said presetting means being responsive to said decoding means for preventing establishing said predetermined timing interval.

4. The digital circuit of claim 3 wherein said logic means further includes a flip-flop coupled to said means for receiving said actuating signals and said flip-flop is held in one state for the duration of said predetermined timing interval to disable further counting of said counting means.

5. The digital circuit of claim 4 wherein said logic means further includes an EXCLUSIVE OR gate coupled to a first NOR gate operating to clock said flip-flop permitting a change of its state to re-enable said counting means.

6. The digital circuit of claim 5 wherein said flip-flop is coupled through a second NOR gate which may be inhibited to disable further counting of said counting means thereby to maintain a predetermined count.

7. The digital circuit of claim 6 wherein said actuating signals are of a predetermined minimum duration.

8. The digital circuit of claim 7 further including verification means coupled to said receiving means for verifying the presence of actuating signals having said predetermined minimum duration by repetitive sampling of the frequency of said signal and comparing each measurement with the immediately preceding frequency count and confidence counting means coupled to said verification means for determining a predetermined number of consecutive identical measurements of said frequency.

9. The digital circuit of claim 8 wherein said system further includes means responsive to said control signal for maintaining said immediately preceding frequency count for the duration of said timing interval.

* * * * *